United States Patent [19]
Saito et al.

[11] Patent Number: 6,000,124
[45] Date of Patent: Dec. 14, 1999

[54] METHOD AND APPARATUS FOR MANUFACTURING MULTILAYER PRINTED CIRCUIT BOARD

[75] Inventors: Tsutomu Saito; Masatoshi Araki; Shigemi Sunamoto, all of Tokyo, Japan

[73] Assignee: Seiko Precision Inc., Tokyo, Japan

[21] Appl. No.: 08/846,066

[22] Filed: Apr. 25, 1997

[51] Int. Cl.$^6$ ....................................................... H05K 3/36
[52] U.S. Cl. ................................. 29/830; 29/720; 29/721; 29/833; 29/834; 156/64
[58] Field of Search ............................. 29/830, 827, 721, 29/720, 833, 834; 15/64

[56] References Cited

U.S. PATENT DOCUMENTS

| | | | |
|---|---|---|---|
| 4,506,442 | 3/1985 | Alzmann et al. | 29/830 |
| 5,046,238 | 9/1991 | Daigle et al. | 29/830 |
| 5,048,178 | 9/1991 | Bindra et al. | 29/721 X |

OTHER PUBLICATIONS

Printed Circuit Fabrication, vol. 10, No. 7 pp. 24–25, 27–30 by M. Angelo, Jul. 1987.

*Primary Examiner*—Carl J. Arbes
*Attorney, Agent, or Firm*—Jordan and Hamburg LLP

[57] ABSTRACT

A method and apparatus for manufacturing a multilayer printed circuit board wherein printed circuit boards are laminated by accurate in positional alignment. A first supporting means for supporting a first printed circuit board is provided on a lower table 11 and second supporting means for supporting a second printed circuit board P2 is provided thereover. One end of the lower table is supported by a first movement means equipped with an XY table mechanism and another end thereof is supported by a Y table mechanism and second movement means for enabling an X-directional free sliding movement. The positions of respective marks m and n on the printed circuit boards are imaged by imaging means. The printed circuit boards are relatively moved by the movement means and the positional error thereof is corrected based on image processing. The first and second printed circuit boards are then secured together.

22 Claims, 12 Drawing Sheets

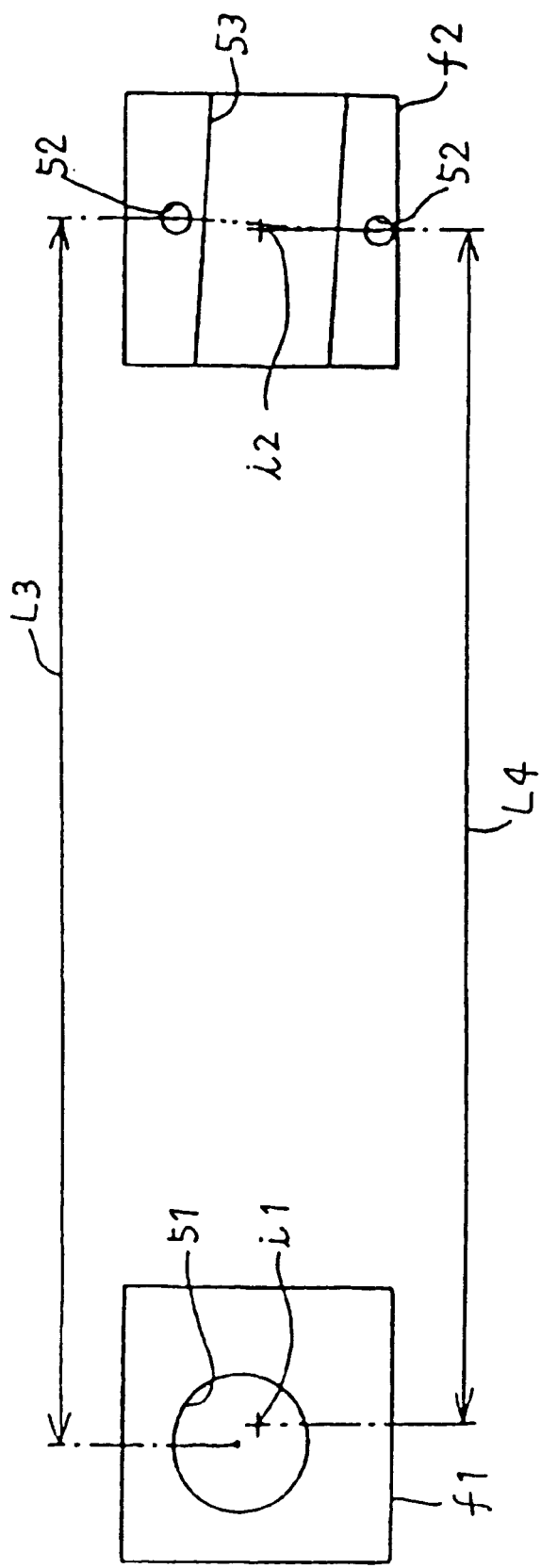

1

METHOD AND APPARATUS FOR MANUFACTURING MULTILAYER PRINTED CIRCUIT BOARD

The present invention relates to a method for manufacturing a multilayer printed circuit board and an apparatus for executing the same.

The increasing complexity of electronic products requires an increase in density of printed circuit boards. One means for realizing an increase in the density of the printed circuit board is a multilayer printed circuit board wherein a plurality of printed circuit boards are laminated whereby the circuits of the respective printed circuit boards are connected to each other. The multilayer printed circuit board is comprised of a plurality of laminated printed circuit boards each having a circuit printed on both surfaces, the laminated printed circuit boards having adhesive layers (pre-pregs) provided therebetween and thereafter being secured to each other. While the mating circuits of the respective printed circuit boards are connected to one another via throughholes, accurate positional alignments become necessary for connections of these circuits. As a means for performing such positional alignments holes are formed at two or four or more positions of each of the opposing surfaces of the respective printed circuit boards and pins are passed through these holes to thereby prevent positional error of the respective circuit patterns.

However, when forming such holes in the respective printed circuit boards and passing the pins therethrough for positioning, the operation of aligning the positions of the pins and passing the pins therethrough is troublesome and, in addition, since the hole positions of every printed circuit board are not always accurate, there is a limitation in terms of the precision. Accordingly, even if it is technically possible to form the holes with a high accuracy on each printed circuit board, realizing this raises a problem in that the production cost becomes high.

SUMMARY OF THE INVENTION

In order to solve the above problems, in the present invention, marks that are respectively formed in a pair of printed circuit boards are imaged to thereby inspect a positional error of both of the printed circuit boards by image processing. This positional error is corrected whereby the printed circuit boards are secured to each other in a state of being previously superposed one over the other in accurate positional relation with each other. Accuracy is obtained because the paired printed circuit boards are secured after having been positionally aligned with a high precision by the use of an image processing technique.

Also, by facilitating the calculation of the distance between imaging means by use of a jig plate that has formed therein a plurality of opening portions, or apertures, the distances between which are previously made known, the calculation of the mark positions of the printed circuit boards is made easy.

In order to attain the above objects, a manufacturing method for manufacturing a multilayer printed circuit board according to the present invention has characteristically enabled the manufacture of a multilayer printed circuit board with no positional error involved therein by supporting a pair of printed circuit boards respectively having a couple of marks in their both end portions, in a state where the paired printed circuit boards oppose each other with a non-cured adhesive layer, imaging the marks in the one end portions of the paired printed circuit boards by a first imaging means and imaging the marks in the other end portions of the paired printed circuit boards by a second imaging means, inspecting the positions of the respective marks by image processing, and determining a relative positional error of the paired printed circuit boards on the basis of the image processing, correcting the positional error by relatively moving the paired printed circuit boards and securing the paired printed circuit boards to each other in a state where the positional error is corrected.

In the above-mentioned means, preferably, the adhesive layer is disposed on either one of the paired printed circuit boards, the other printed circuit board is supported in a non-contact state with a prescribed distance to the adhesive layer and the printed circuit boards are relatively moved; and, after the printed circuit boards have been relatively moved the other printed circuit board is laminated on the adhesive layer.

Also, in the above-mentioned means, preferably, in a case where there is a difference error between the distance of the marks of one of the printed circuit boards and the distance of the marks of the other printed circuit board, the value of a half of the difference error is shared to one end portion and the other end portion, whereby the both printed circuit boards are relatively moved so that the distance of the marks of one of the paired printed circuit boards and the distance of the marks of the other of the paired printed circuit boards may be equal to each other.

Further, in any one of the above-mentioned means, preferably, the marks of one of the paired printed circuit boards are formed in a ring form and the marks of the other of the paired printed circuit boards have a diameter smaller than that of the ring shaped marks, whereby the imaging is performed in a state where the marks of the other printed circuit board are located within the ring shaped marks, to thereby facilitate the center-of-gravity calculation and sharing calculation of the marks.

Also, in each of the above-mentioned means, the present invention makes it possible to manufacture a multilayer printed circuit board having three or more printed circuit boards laminated therein by making at least one of the paired printed circuit boards a multilayer printed circuit board composed of a plurality of layers or a plurality of preliminarily laminated printed circuit board.

Also, the above-mentioned manufacturing method for manufacturing a multilayer printed circuit board, preferably, comprises the steps of disposing a jig plate having a plurality of opening portions at predetermined distances so as to be superposed on the printed circuit board, imaging one of the opening portions of the jig plate during imaging the mark in one end portion by the first imaging means and imaging another one of the opening portions of the jig plate during imaging the marks in the other end portion by the second imaging means, inspecting by the image processing the center positions of the opening portions within image regions of the imaging means, calculating a distance between the imaging means on the basis of the center positions of the respective opening portions within the respective image regions and the known distance of the imaged opening portions, and determining the amounts of relative movements for correcting the positional errors of the paired printed circuit boards on the basis of the calculated distance between the imaging means.

Preferably, the paired printed circuit boards are secured by applying ultrasonic vibrations by the use of a horn whose tip end portion is substantially shaped like a ring after correction of the positional error of the printed circuit boards, and thereafter causing fusion of the adhesive layer clamped between the printed circuit boards.

The present invention provides a manufacturing apparatus for executing the above-mentioned manufacturing method for manufacturing a multilayer printed circuit board from a pair of printed circuit boards having marks formed in their both end portions that are secured to each other through an adhesive layer, the apparatus comprising first supporting means for supporting one of the paired printed circuit boards, second supporting means for supporting the other of the paired printed circuit boards so as superpose the paired printed circuit boards, a first imaging means capable of simultaneously imaging the marks in one end portion of the paired printed circuit boards, a second imaging means capable of simultaneously imaging the marks in the other end portion of the paired circuit boards, movement means for moving one of the paired printed circuit boards relative to the other one of the printed circuit boards, in order to correct relative positional error of the paired printed circuit boards on the basis of the positions of the respective marks inspected by imaging processing, and securing means for securing the paired printed circuit boards to each other in a state where the positional error is corrected.

Preferably, the above-mentioned movement means includes a first XY table means for moving the one printed circuit board in a lengthwise direction and a widthwise direction thereof and another XY table means with the first XY table means in order to move the one printed circuit board in the widthwise direction, to thereby enable self-alignment on the basis of the image processed results that have been obtained by image processing of the images that have been imaged by the above-mentioned imaging means.

Preferably, the supporting means are provided in such a way as to be moved toward or away from each other, to thereby cause the paired printed circuit boards to be secured to each other and thereby enable this securing thereof in a state where no positional error occurs therebetween.

Also, preferably, in the above-mentioned manufacturing apparatus for manufacturing a multilayer printed circuit board, a jig plate is disposed on one of the supporting means, the jig plate has a plurality of opening portions, or apertures, for positional confirmation of the imaging means, the opening portions being formed at predetermined distances, at least one of the opening portions being imageable by the first imaging means simultaneously with the marks located at the end portion of the paired printed circuit boards, and at least another one of the opening portions being imageable by the second imaging means simultaneously with the marks located at the other end portion of the paired printed circuit boards, to thereby facilitate positional confirmation of the respective imaging means.

Preferably, the securing means is an ultrasonic welding means having a horn whose tip end portion is substantially shaped like a ring.

BRIEF DESCRIPTION OF THE DRAWINGS

FIG. 8 is a view illustrating in another embodiment of the present invention wherein distances between opening portions formed in a jig plate and the distance between the imaging means are related.

DETAILED DESCRIPTION OF THE INVENTION

Figure 1:
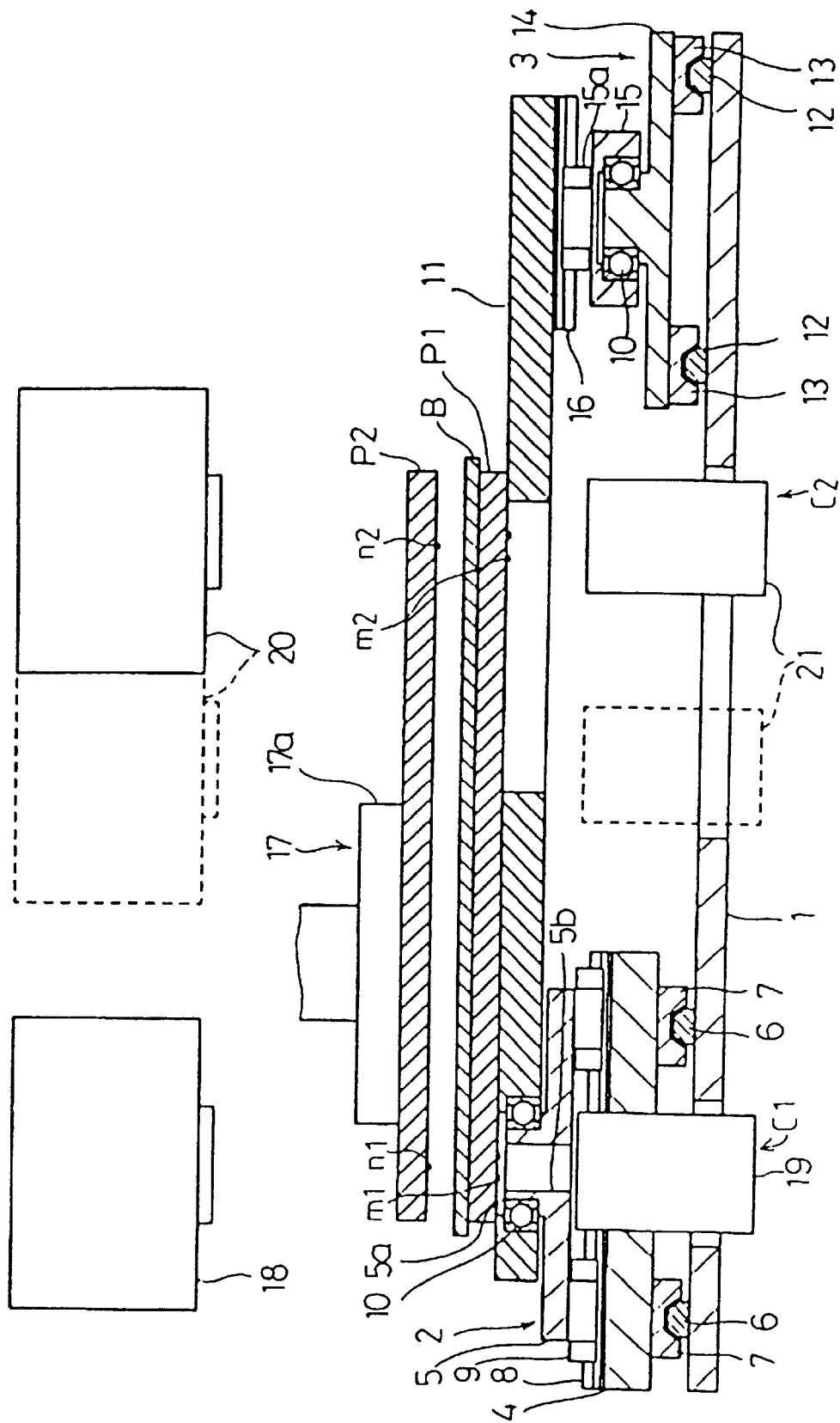
FIG. 1 is a sectional view showing a manufacturing apparatus for manufacturing a multilayer printed circuit board according to the present invention wherein a pair of printed circuit boards are supported with a prescribed gap therebetween in a state of non-contact with each other.
Figure 2:
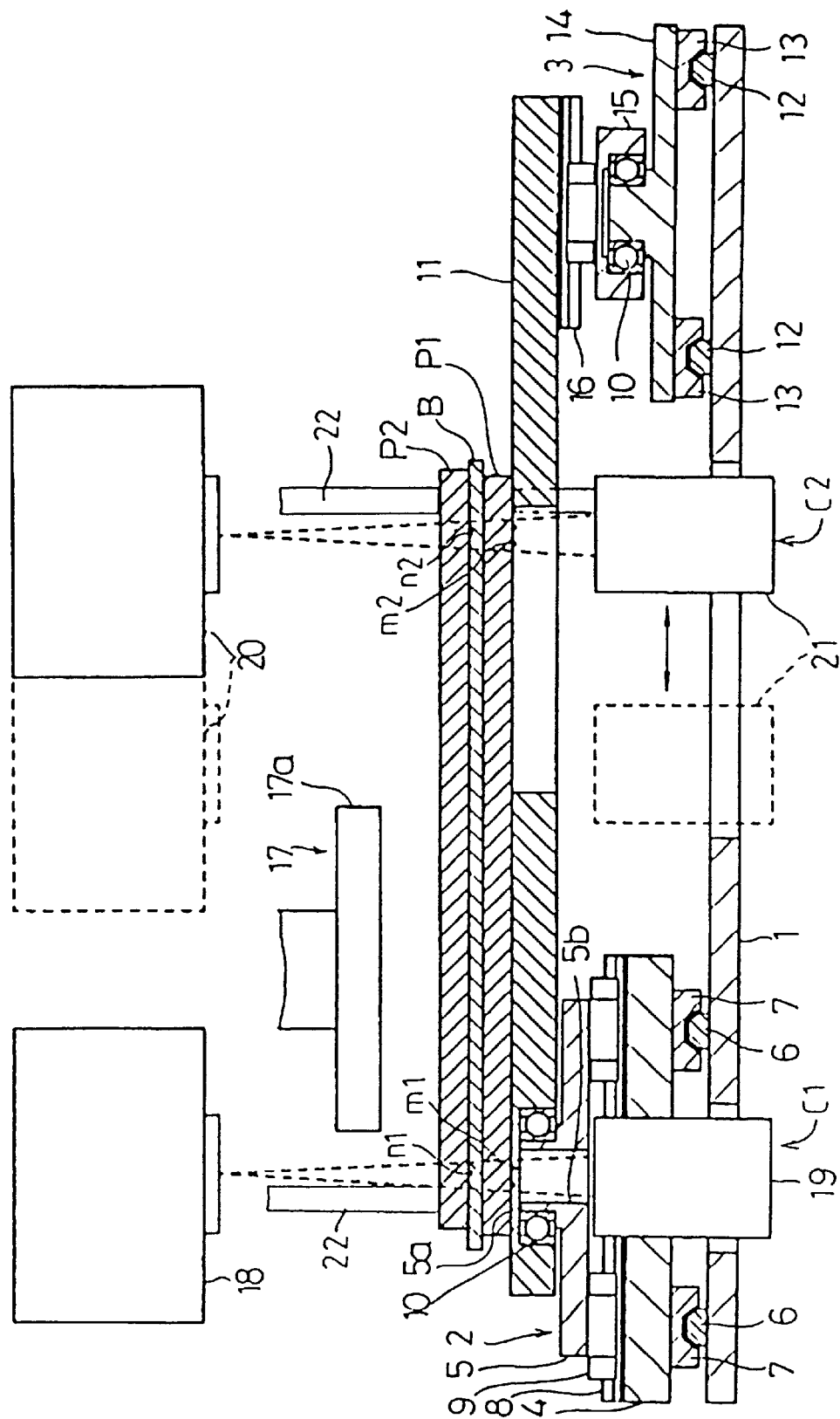
FIG. 2 is a sectional view showing the apparatus of FIG. 1 wherein the pair of the printed circuit boards are bonded to each other with an adhesive layer therebetween.

Referring to FIGS. 1 and 2, an explanation is given of a multilayer printed circuit board P. As a multilayer printed circuit board having the simplest structure, there is that which comprises two printed circuit boards P1 and P2 each having a circuit pattern formed on each surface, the two printed circuit boards being bonded to each other in such a way that an adhesive layer B is interposed between opposing surfaces thereof. In both end portions of each printed circuit board there are respectively formed beforehand marks m1, m2, n1 and n2 for positional alignment. Also, there are multilayer printed circuit boards in which three printed circuit boards are laminated (six layers) or a printed circuit board structure in which four printed circuit boards are laminated (eight layers). Ordinarily, copper plates are bonded to the upper and lower surfaces of each printed circuit board through adhesive layers (having insulative property) and these copper plates are patterned by, for example, etching. That is, two laminated printed circuit boards, three laminated printed circuit boards and four laminated printed circuit boards have six-, eight- and ten-layer patterns, respectively.

Each of the printed circuit boards P1 and P2 that constitute the multilayer printed circuit board is formed of an epoxy resin plate having circuit patterns formed on both surfaces. The adhesive layer B consists of a semi-cured resin sheet (pre-preg street). The adhesive layer B is curable by heating so as to make the paired printed circuit boards securable to each other.

Next, a manufacturing apparatus for manufacturing a multilayer printed circuit board according to the present invention will now be explained with reference to FIGS. 1 and 2.

On a fixed table 1 there is provided movement means M for moving the printed circuit board P. The movement means M is composed of a first XY table means 2 that is provided at the left end of a lower table (first supporting means) 11 to enable the movement of the printed circuit board in a lengthwise direction and a widthwise direction thereof and second XY table means 3 that is provided on the right side of the lower table 11 in juxtaposed relation to enable the movement of the printed circuit board in the widthwise direction.

The first XY table means 2, which is a first movement means, is equipped with a Y table 4 and XY table 5 that are placed on the upper surface of the fixed table 1. The Y table 4 is provided in a Y direction (in a direction perpendicular to the surface of the drawing sheet) through first Y-axial guides 7 and 7 that have been fitted onto first Y-axial rails 6 and 6 that extend in the direction perpendicular to the surface of the drawing sheet. On the upper surface of the Y table 4 there are provided X-axial rails 8 and 8 (only the rail located near side is illustrated) in parallel relation with the surface of the drawing sheet. The XY table 5 is placed on the X-axial rails through X-axial guides 9 and 9. The Y table 4 is freely movable in the Y directions (the widthwise direction of the printed circuit board) by driving means not illustrated. The XY table 5 is freely movable in the X direction (the lengthwise direction of the printed circuit board) similarly by driving means not illustrated. As a result, by driving each driving means, the XY table 5 is arbitrarily movable in the X and Y directions.

At a central part of the XY table 5 there is provided a lower table support portion 5a that is formed cylindrically in such a way as to protrude through the upper surface. At a central part of the lower table support portion 5a there is provided an imaging hole portion 5b. Also, onto an outer-peripheral portion of the lower table support portion 5a there is fitted a ball bearing 10, whereby the lower table 11 is rotatably supported in a horizontal plane. The lower table support portion 5a supports the lower table 11 to enable the movement thereof in the lengthwise direction and widthwise direction through the ball bearing 10.

The second XY table means 3, which is a second movement means, is provided on the right end of the upper surface of the fixed table 1, and is provided movably in the Y direction (the widthwise direction of the printed circuit board) while supporting the right end of the lower table 11. The second XY table means 3 is equipped with a Y table 14 that is supported via Y-axial guides 13 and 13 on second Y-axial rails 12 and 12 that are provided on the fixed table 1 in a direction perpendicular to the surface of the drawing sheet. The Y table 14 is movable in the widthwise direction (the direction perpendicular to the surface of the drawing sheet) by driving means not illustrated. Onto a cylindrical protrusion portion 14a that is formed at a central part of the upper surface of the Y table 14 there is fitted a connection member 15 through a ball bearing 10. A second X-axial guide 15a is integrally provided on the upper surface of the connection member 15. The second X-axial guide 15a is fitted onto a second X-axial rail 16 that is provided on the underside of the lower table 11. Whereby, the lower table 11 is made movable in the X direction (the longitudinal direction) relative to the Y table 14. Accordingly, the left end of the lower table 11 is movable in both the longitudinal direction and widthwise direction by the first XY table means 2 while, on the other hand, the right end thereof is movable not only in the widthwise direction by the second XY table means 3 but also in the longitudinal direction by the first movement means through the second X-axial guide 15a and second X-axial rail 16. Also, the rotation in the horizontal plane of the lower table 11 that results from the difference in amount of Y-directional movement between the first and second XY table means 2 and 3 is accommodated by the ball bearings 10 and 10.

The lower table (first supporting means) 11 has built therein adsorption means (which does not appear in the drawing) for adsorbing and fixing a lower printed circuit board P1 that is placed thereon. Also, on the upper surface of the lower table 11 there is provided second supporting means 17 for adsorbing and supporting a multilayer printed circuit board or an upper printed circuit board P2 intended to be laminated on the lower printed circuit board P1. The second supporting means 17 has an adsorption portion in the underside of a chuck portion 17a which is communicated with a vacuum pump. It is movable toward or away from the adsorption means integral with the lower table 11.

Above the first XY table means 2, which is the first movement means, there is provided a first X-ray generator 18 that constitutes first imaging means C1. Below the XY table 5 there is provided an X-ray camera 19 which images transmitted X-rays radiated from the first X-ray generator 18. The X-rays radiated from the X-ray generator 18 transmit through the printed circuit boards P1 and P2 and, by passing through the hole portion 5b provided in the XY table 5, reach the first X-ray camera 19 and image the positioning marks m1 and n1 provided in the printed circuit boards. (see FIG. 2)

On the right side of the first imaging means C1 there is provided second imaging means C2. Second X-ray generator 20 and second X-ray camera 21 constitute a second imaging means C2 and are provided in such a way as to be integrally movable, respectively, by movement means not illustrated.

As illustrated in FIG. 2, above and below the lower table 11 there are provided a plurality of securing means 22 and 22 for applying pressure onto the mating printed circuit boards and thereby securing them to each other (securing means at only two positions alone are illustrated). Each of the securing means 22 consists of a device actuated, after mating the printed circuit boards to abut against each other, to clamp the printed circuit boards by opposing electrodes in such a way as to move forward ends thereof toward each other and, while pressurizing the mated printed circuit boards, to supply electricity to the electrodes and thereby heat the adhesive layer. By the heating using the electrodes, the adhesive layer (pre-preg) B that is interposed between the mating printed circuit boards is partially cured to thereby enable the both printed circuit boards to be secured to each other.

Figure 3:
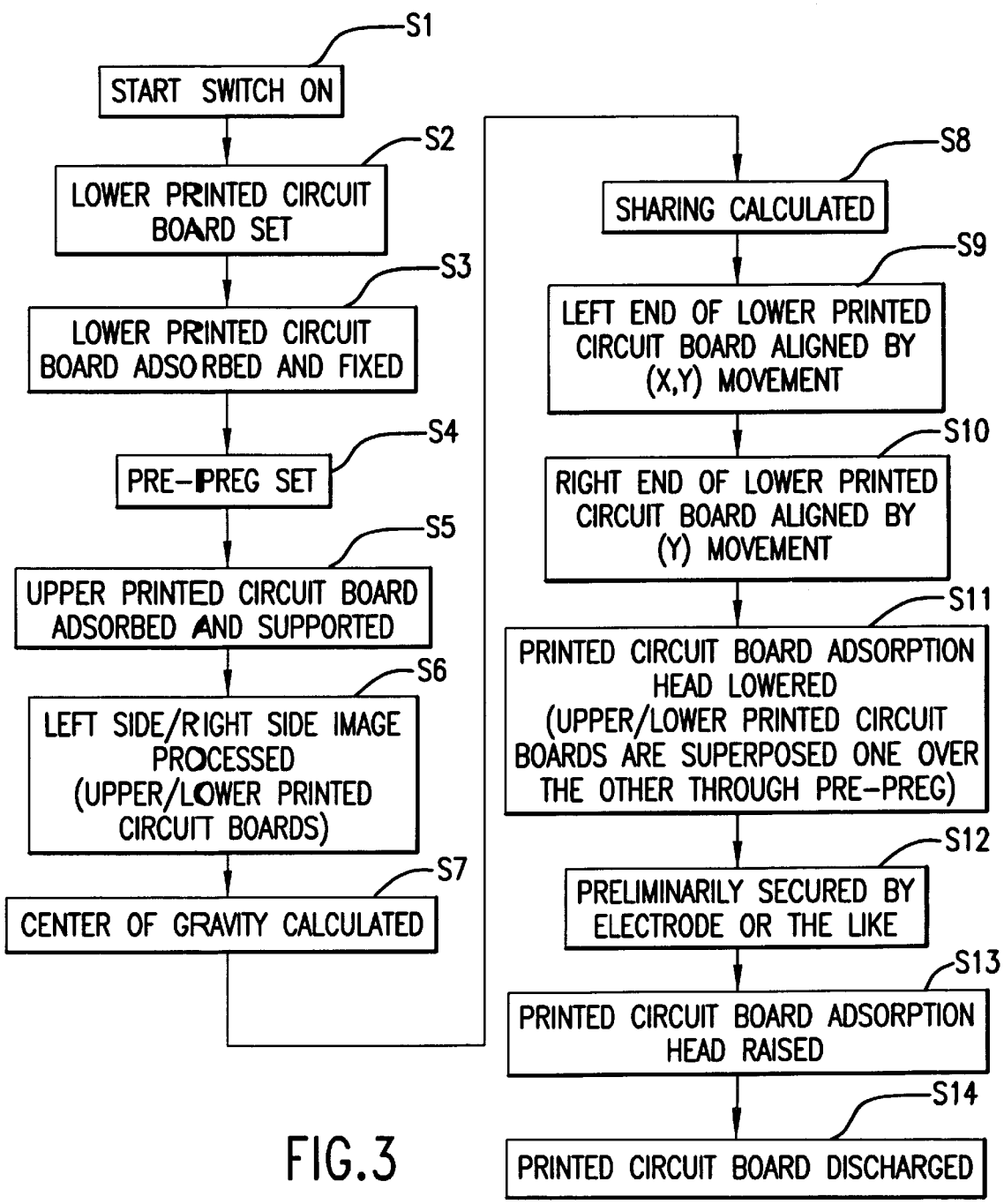
FIG. 3 is a flow chart illustrating multilayer printed circuit board manufacturing steps according to an embodiment of the present invention.

Next, a manufacturing method for manufacturing a multilayer printed circuit board will now be explained according to a flow chart that is illustrated in FIG. 3.

In FIG. 1, when a start switch is tuned ON (step 1), first, the lower printed circuit board P1 is adsorbed and supported by the second supporting means 17 and is placed on the upper surface of the lower table 11 (step 2). At this time, the mark m1 is imaged by the first imaging means C1, whereby a center thereof is determined and it is arranged that this center and a center of the ball bearing 10 are substantially in alignment with each other. The lower printed circuit board P1 that has been placed on the lower table 11 is adsorbed and secured to a prescribed position on the lower table by the adsorption means that is provided thereon (step 3).

Next, the adhesive layer B is formed (pre-preg set) on the upper surface of the lower printed circuit board P1 by pre-preg supply means (the illustration thereof is omitted) (step 4).

Next, by the second supporting means (printed circuit board adsorption head) 17 the upper printed circuit board 2 is taken out, by being adsorbed, from an upper printed circuit board accommodation portion (not illustrated) and is moved to a prescribed position and, with a prescribed gap being provided between the upper printed circuit board P2 and the adhesive layer B, is supported in a state of non-contact therewith (step 5). FIG. 1 illustrates a state where the lower printed circuit board P1 and the upper printed circuit board P2 are supported with a prescribed gap therebetween by the supporting means, respectively.

As stated previously, the positioning mark m1 that is formed on the left end of the lower printed circuit board P1 is set so as to fall within an image range of the first imaging means C1 while, on the other hand, the positioning mark n1 that is formed on the left end of the upper printed circuit board P2 is similarly set so as to fall within this image range.

Figure 4:
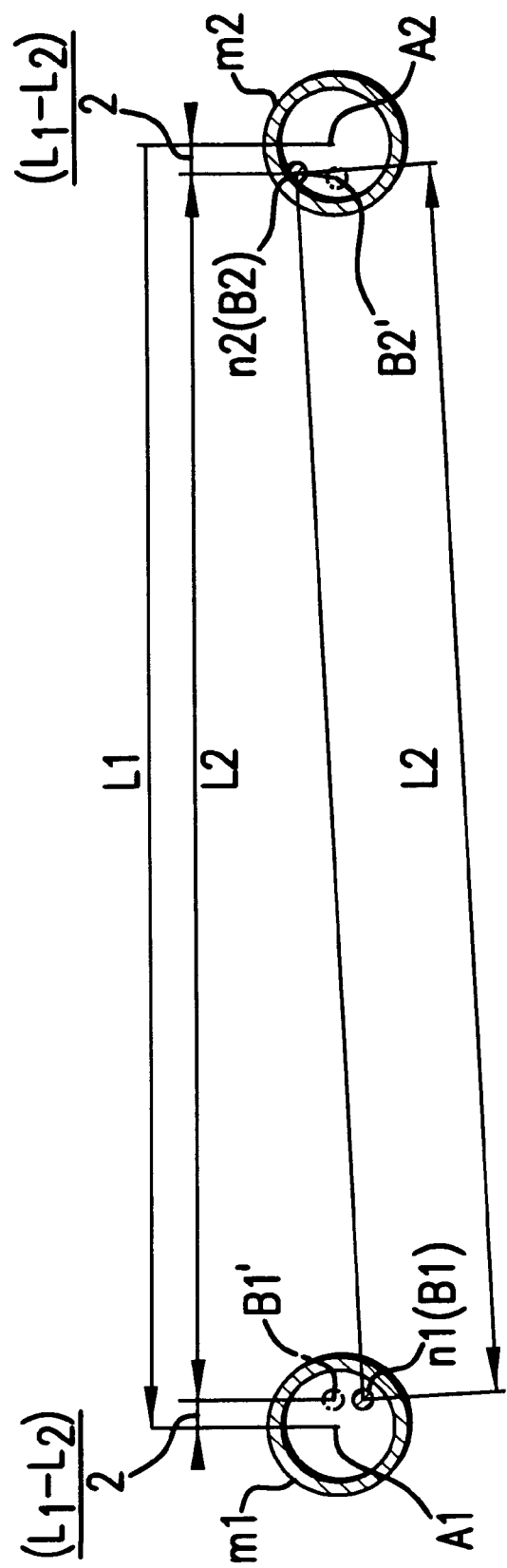
FIG. 4 is a view illustrating a correction that is performed of positional error between marks of the paired printed circuit boards.

Next, the marks m1 and n1 at the left end of the upper and lower printed circuit boards are imaged by the first imaging means C1 and the marks m2 and n2 at the right end of the upper and lower printed circuit boards are imaged by the second imaging means C2 (see FIG. 4). Imaging of the marks by the respective imaging means C1 and C2 is performed by radiating X rays onto the mark positions from the respective X-ray generators 18 and 20 and imaging the X-ray image of the marks by the X-ray cameras 19 and 21 (see FIG. 2).

In order to ease image processing of the marks m and n, the marks m1 and m2 in the lower printed circuit board P1 are made in a ring-shaped mark having its inside rendered blank and the marks n1 and n2 of the upper printed circuit board P2 are made to be black circular marks that can fall within this ring shaped mark (see FIG. 4). These marks m and n are image processed (step 6) and the lower table 11 is moved and adjusted so as to cause the mark of the upper printed circuit board to fall within the blank rendered portion of the ring-shaped mark of the lower printed circuit board.

FIG. 4 illustrates a state where the dot marks n1 and n2, that have been formed in the upper printed circuit board P2, are existent within the white rendered marks m1 and m2, that have been formed in the lower printed circuit board P1, respectively. By placing the centers A1 and A2 of the white rendered marks and the centers B1 and B2 of the dot marks, respectively into alignment with each other, both the printed circuit boards are brought to a state of mutual complete positional alignment or coincidence. However, it is very rare that the both centers come into positional coincidence with each other from the outset, and, ordinarily, both the centers are out of mutual positional coincidence as illustrated.

When the respective marks m and n are imaged by the respective imaging means C1 and C2, there are performed by an image processor (the illustration thereof is omitted) centers-of-gravity (center) calculations that determine the positions A and B of the centers of the marks (step 7). As a result of the center-of-gravity calculations, first, calculations are performed of the deviation between a connection line that connects the centers of gravity A1–A2 and a connection line that connects the centers of gravity B1–B2. Therefore, according to the calculation values, under the assumption that both the ends of the printed circuit board P1 have been respectively moved in the Y direction (the direction perpendicular to the surface of the drawing sheet of FIG. 1), calculations are performed of the distances L1 and L2 between the center positions that are located when the center positions of both the respective marks have coincided with each other. While as a result an error (L1–L2) is produced between the distance L1, between the center positions A1 and A2 of the lower printed circuit board P1, and the distance L2, between the center positions B1 and B2 of the upper printed circuit board P2, an error is calculated and its half (L1–L2)/2 is used by each of the left and right end portions (step 8). Whereby, self-aligning is performed so that the distances between the centers of the marks m of both the ends of one printed circuit board P1 and the centers of the marks n of both the ends of the other printed circuit board P2 may be equalized with each other. Namely, the distances between A1 and B1 is made equal to the distance between A2 and B2.

When, as mentioned above, the positional errors are calculated by image processing whereby positions B1' and B2' to which the marks of the upper printed circuit board are to be moved are determined, the first XY table means 2 is moved whereby the lower table 11 is moved in the XY direction. As a result of this, the center position B1 of the mark of the left end of the upper printed circuit board is relatively moved so as to coincide with the target position B1' (step 9). At this time, the lengthwise movement of the lower table 11 is performed by only the first XY table means 2. The second XY table means 3 accommodates this movement by the second X-axial rail 16 effecting XY sliding movement along the second X-axial guide 15a. In contrast to this, the widthwise swing of the lower table 11 made by the second XY table means 3 is accommodated by the ball bearings 10 and 10. After the center position B1 of the mark of the left end has coincided with the target position B1, the center position B2 of the mark of the right end of the upper printed circuit board is relatively moved so as to coincide with the target position B2' (step 10). This positional alignment is performed by the movement of the right end of the lower table 11 made by the second XY table means 3 in the XY directions. At this time, similarly, the swing of the lower table is accommodated by the ball bearings 10. It is to be noted that it may be also arranged for the relative movement to be made after the target positions to which the marks of the lower printed circuit board are to be moved have been calculated.

After the positional error has been corrected on the basis of the center positions A1 and B1 and the center positions A2 and B2 of the respective marks of the upper and lower printed circuit boards as mentioned above, the adsorption head 17, which is the second supporting means, is next lowered and, as illustrated in FIG. 2, the upper printed circuit board P2 is set on the adhesive layer B that has been set on the lower printed circuit board P1 (step 11). Since the adhesive layer B is in a semi-cured condition, mere setting thereon of the upper printed circuit board enables no bondage therebetween.

Next, the forward ends of the electrodes 22, which are an example of the securing means, are pressed against both the mutually superposed printed circuit boards, whereby the adhesive layer is locally heated by supply of electricity to each of the electrodes and the heated portions of the adhesive layer are secured at several positions preliminarily (step 12).

Upon completion of the preliminary securing, the fixation of the lower printed circuit board P1 to the lower table 11 by the first supporting means 11a is released whereby the adsorption head 17, which is the second supporting means, is raised while supporting the preliminarily mutually secured printed circuit board P that consists of the two bonded printed circuit boards P1 and P2 (step 13). The adsorption head 17 is moved, while supporting the preliminarily secured printed circuit board P, by movement means not illustrated and releases and discharges it into a printed circuit board recovering box (the illustration thereof is omitted) (step 14).

The preliminarily secured printed circuit board that is obtained by the lower printed circuit board P1 and the upper printed circuit board P2 being preliminarily secured to each other through the adhesive layer B is wholly fused by being thermally pressurized by a hot press which is another device, whereby a multilayer printed circuit board becomes finished. Since both the printed circuit boards are preliminarily secured together in a state of positional alignment or coincidence with each other, there is no likelihood, even after they have been hot pressed, that the both printed circuit boards may be positionally displaced. According to the present invention, since their positional coincidence and securing (or preliminary securing) are performed continuously with the use of a single apparatus, there is almost no likelihood that the printed circuit boards may be positionally displaced.

Next, another embodiment will be explained.

In this embodiment, there is adopted a jig plate for facilitating the positional confirmation of the imaging means in the manufacturing apparatus for manufacturing a multilayer printed circuit board, that has been explained in the above-mentioned embodiment. The calculation of the mark position of the printed circuit board is made reliable and easy by ex ante positional confirmation of the imaging means that is made for each manufacturing step for manufacturing the jig plate.

Figure 5:
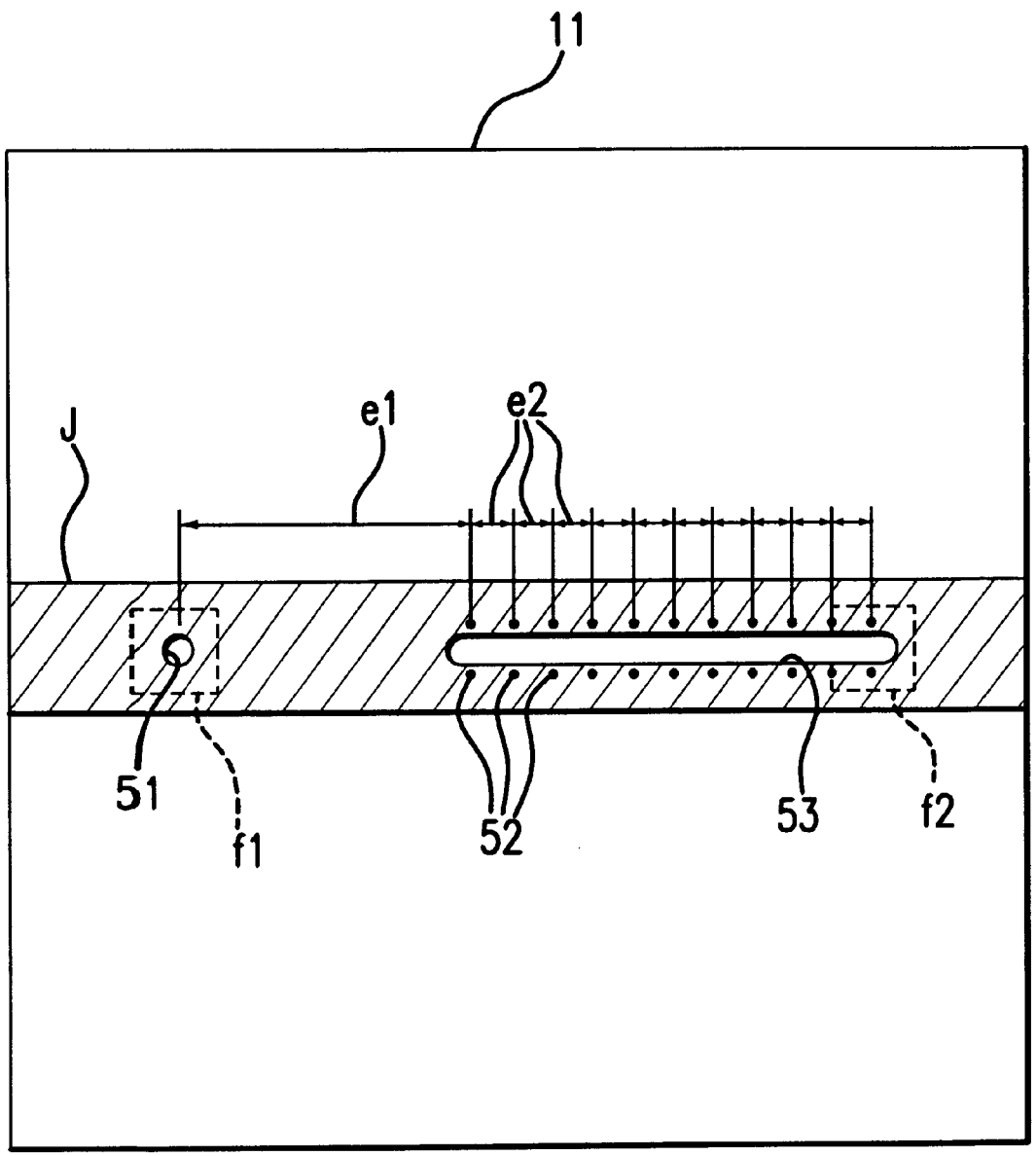
FIG. 5 is a plan view illustrating a state where a jig plate has been provided on the lower printed circuit board.

As illustrated in FIG. 5, the jig plate J consists of a rectangular plate member having a prescribed width and the same length as that of the lower table 11, which plate member has formed therein a plurality of openings for the positional confirmation of the imaging means. The openings include a first opening portion 51 which is provided at a position that can be imaged by the first imaging means C1 simultaneously with the marks located at the one end portions of the printed circuit boards and second opening portions 52 which are juxtaposed so as to oppose positions that can be imaged by the second imaging means C3 (see FIGS. 6 and 7) simultaneously with the marks located at the other end portions of the printed circuit boards. Since the distances between the opening portion at one side and those at the other side are previously known, if the imaging means are moved, by determining the distance between the both imaging means on the basis of the opening portions and determining the amounts of movement of the imaging means accordingly, accurate positional alignment between the upper and lower printed circuit boards is easy to effect. It is to be noted that an elongate opening 53, that is provided in parallel with the row of the second opening portions 52, is a mark-imaging window opening.

Here, an explanation will be given of the outline of a manufacturing apparatus for manufacturing a multilayer printed circuit board which has adopted the jig plate according to the present invention.

Figure 6:
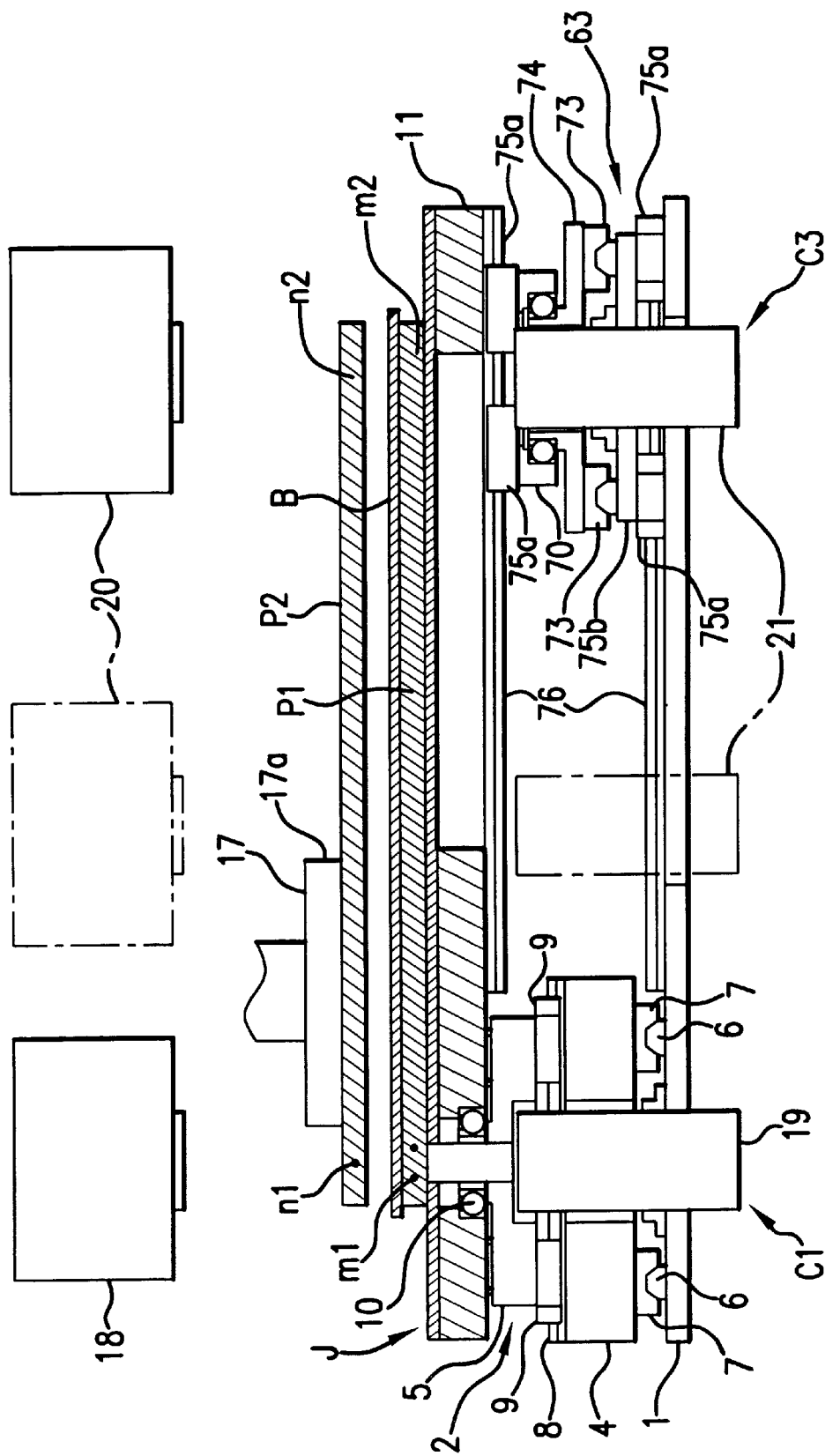
FIG. 6 is a sectional view showing another embodiment of the present invention wherein a pair of printed circuit boards are supported with a prescribed gap therebetween in a state of non-contact with each other.
Figure 7:
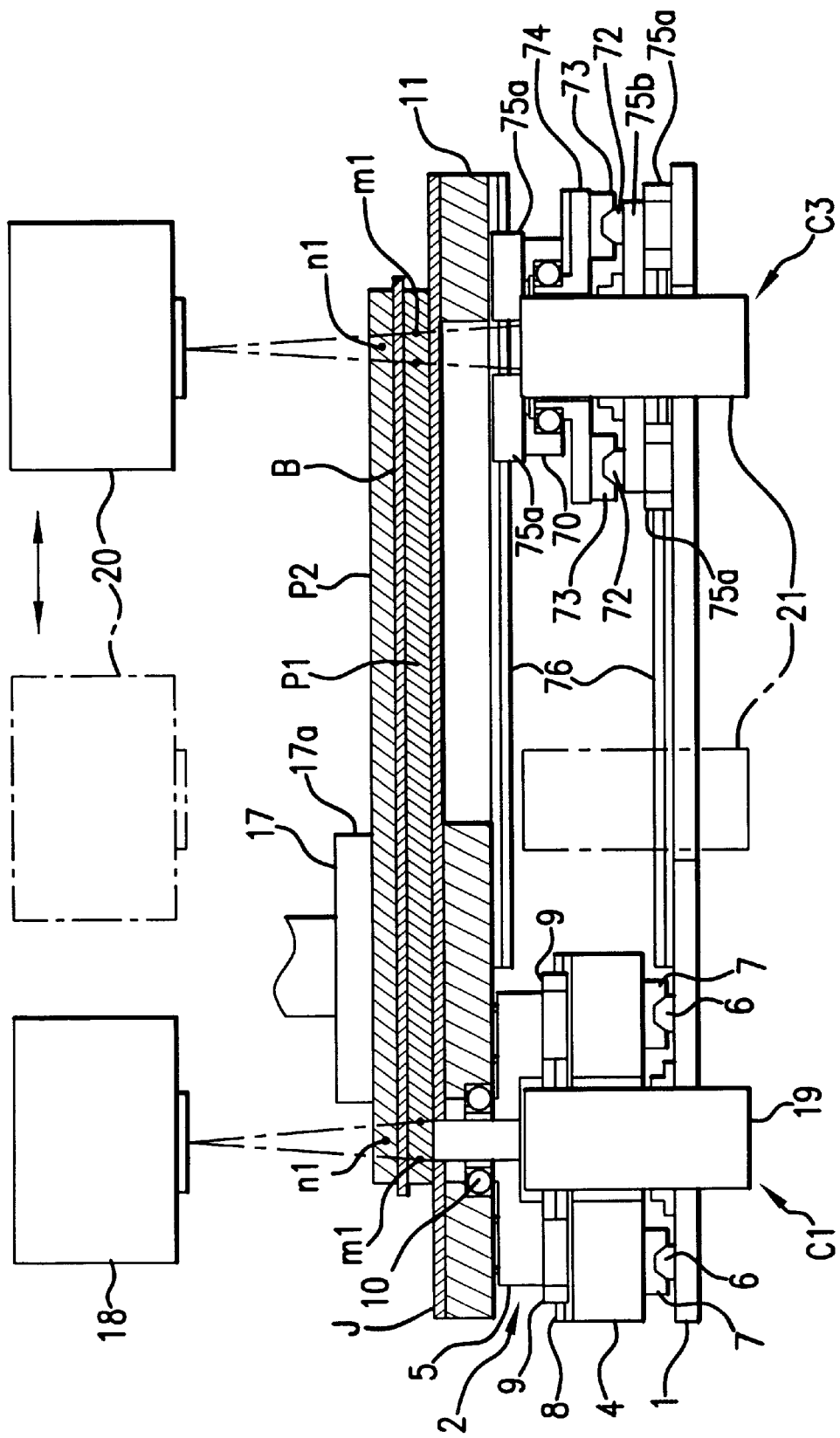
FIG. 7 is a sectional view showing the embodiment of FIG. 6 wherein a pair of the printed circuit boards are bonded to each other with an adhesive layer therebetween.

As illustrated in FIGS. 6 and 7, since the basic structure is the same as in the case of the above-mentioned embodiment, only the portions which differ therefrom alone are explained and an explanation of the common portions is omitted with these common portions being denoted by the same reference symbols in the drawing.

FIGS. 6 and 7 illustrate a state where the printed circuit boards are positionally aligned with each other with the jig plate J being set on the upper surface of the lower table 11. The first opening portions 51 of the jig plate J, mark m1 of the lower printed circuit board P1 and mark n1 of the upper printed circuit board P2 are imaged simultaneously by the first imaging means C1.

On the other hand, the second imaging means C3 that images the right side of the multilayer printed circuit board is mounted on a second XY table means 63 in such a way as to be integrally movable therewith. The second XY table means 63 is provided in such a way as to be movable in the X direction (the lengthwise direction of the multilayer printed circuit board) by being guided by second X-axial rails 76 and 76 that are laid on the upper surface of the fixed table 1 and on the underside of the lower table 11, respectively. A movable table 75b of the second XY table means 63 is secured onto X-axial guides 75a that are movably provided on the second X-axial rail 76 that is laid on the upper surface of the fixed table 1. On the upper surfaces of the movable table 75b there are provided second Y-axial rails 72 and 72 that extend in the Y direction (the widthwise direction of the multilayer printed circuit board). Above the movable table 75b there is provided a second Y table 74 supported via second Y-axial guides 73 and 73 installed on the second Y-axial rails 72. A central part of the Y table 74 is raised cylindrically and a Y table support portion is thereby formed. A ball bearing 70 is fitted around the Y table support portion. The upper surface of the ball bearing 70 is secured to a X-axial guide 75a that is coupled to the underside of the lower table 11.

Since this manufacturing apparatus is constructed as mentioned above, the X-ray camera 21 of the second imaging means C3 is not only movable in the Y-axial direction (the widthwise direction of the multilayer printed circuit board) by the second XY table means 63 but also movable in the X direction along the X-axial rails 76 and 76 by the movable table 75b as mentioned above. The second imaging means C3 can image simultaneously at least one of the second opening portions 52 of the jig plate J, mark m2 of the lower printed circuit board P1 and mark n2 of the upper printed circuit board by being moved in the X direction along the second X-axial rails 76 and 76.

Next, an explanation will be given of a positional alignment method for performing the positional alignment of the upper printed circuit board P2 with the lower printed circuit board P1 according to this embodiment.

As illustrated in FIG. 8, the first opening portion 51 of the jig plate J is located within an image region f1 of the X-ray camera 19 (see FIG. 6) of the first imaging means C1 and the second opening portions 52 and 52 are located within an image region f2 of the X-ray camera 21 of the second imaging means C3. Of a number of juxtaposed second opening portions 52, in a state where the second Y table 74 and second imaging means C3 are moved along the X-axial rails 76 and 76 up to a position at which the mark m2 of the lower printed circuit board P1 falls within the image region, the two opening portions 52 illustrated in FIG. 8 are located within the image region f2. At this time, the distance between centers (i1, i2) of both the image regions f1 and f2 are easily calculated on the basis of a known distance L3 between the opening portions 51 and 52.

That is, the center of the first opening portion 51 and the centers of the second opening portions 52 (either one thereof may be available) are determined by image processing. Determination is made of the relative positional relationship between the center i1 of the image region f1 and the center of the first opening portion 51 as well as the relative positional relationship between the center i2 of the image region f2 and the centers of the second opening portions 52.

Since the distance L3 between the both opening portions 51 and 52 is already known, when taking the above-mentioned relative positional relationship into consideration, the distance L4 between the centers i1 and i2 of the both image regions are determined.

When imaging the opening portions 51 and 52, the marks m1 and m2 of the lower printed circuit board P1 and the marks n1 and n2 of the upper printed circuit board P2 are imaged simultaneously. In the case of the first embodiment, the XY table means 2 and 3 operate so that the marks B1 and B2 of the upper printed circuit board may come to the target positions B1' and B2' in conformity with the marks A1 and A2 of the lower printed circuit board (see FIG. 4). Specifically, first, the center B1 of the left mark of the printed circuit board is moved to the position B1' by the first movement means 2 and subsequently the center B2 of the right mark is moved to the position B2' by the second movement means 3. At this time, the printed circuit board has its right side moved with its left side being fixed. Likewise, as illustrated in FIG. 7, since the imaging means C1 and C3 are incorporated in the centers of the XY table means 2 and 63, the imaging means C3 side is rotated about the center i1 of the imaging means C1 (see FIG. 8). Here, the previously determined distance L4 between the imaging means C1 and C3 is the radius of rotation. Since the radius of rotation is previously known in this way, the amount of movement of the XY table means 3 for causing the mark B2 to come to the position B2' can be calculated accurately.

In the case of the first embodiment when the right side of the printed circuit board is moved an error is made by the extent to which the rotary movement is additionally made with the result that correction should be performed in such a way as trial and error. However, in the second embodiment, because the rotation radius is previously known, it is possible to calculate the amount of movement resulting from the rotary movement. The amount which the movement means 3 should be moved is determined with this rotary movement also taken into consideration, with the result that the mark center B2 is moved to the position B2' easily and accurately.

FIG. 7 illustrates a state where, after the marks m1 and n1 and marks m2 and n2 of the respective printed circuit boards P1 and P2 are respectively positionally aligned with each other as mentioned above, both the printed circuit boards are laminated through the pre-preg B. The thereafter succeeding steps are the same as those which have been stated in the above-mentioned embodiment.

In this embodiment, the distance between the opening portions of the jig plate is previously known, whereby the distance between centers of the visual fields of the X-ray cameras 19 and 21 is determined on the basis of the centers of these opening portions, with the result that the amounts of movement of the XY table 3 and 63 are determined accurately and easily.

Also, since the second opening portions 52 are formed in such a way that each pair of opening portions oppose each other, with the elongate opening 53 in between, and the opening portions on each side are juxtaposed with each other, by determining the degree of inclination within the image region of each of the lines connecting these opening portions the mounting error of the imaging means C3 is known, whereupon this mounting error is used as correction data when moving the imaging means.

Also, since each opening portion of the jig plate can always be imaged, this can provide adaptability for age deterioration of the machine, with the result that accurate alignment between the mating printed circuit boards becomes possible for a long period of time. Further, since the marks are positionally aligned in conformity with the opening portions of the jig plate, the amount of camera displacement is made known when the camera is replaced for example. Therefore, there is the merit that the positional alignment of a new camera becomes easy when the old camera is replaced thereby.

It is to be noted that although, actually, the marks A1, A2, B1 and B2 illustrated in FIG. 4 and the opening portions 51 and 52 illustrated in FIG. 8 appear within the same image plane, for brevity of the explanation, both the illustrations are made by being divided into FIG. 4 and FIG. 8.

Although the foregoing explanations that regards each of the above-mentioned embodiments is given of the structure wherein the mating ones of a single printed circuit board (single-sided board or double-sided board) having a circuit pattern formed in its surface are laminated one over the other, regarding the printed circuit board, one or both of the lower and upper printed circuit boards may be a multilayer printed circuit board or a plurality of mutually secured printed circuit boards.

Figure 9B:
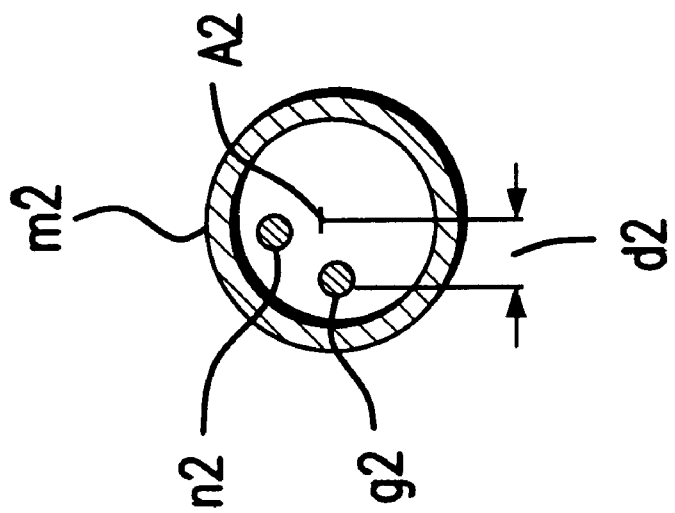
FIG. 9 is a view illustrating positions of the marks that appear when a multilayer printed circuit board is used as one of the paired printed circuit boards.
Figure 9A:
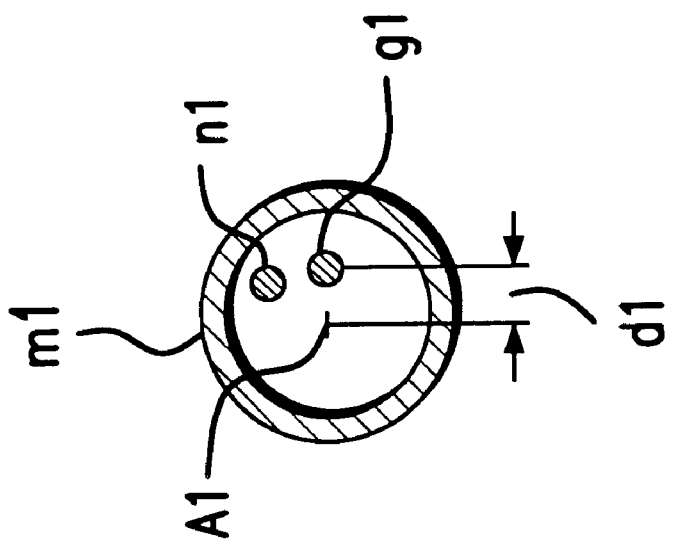

For example, when the lower printed circuit board is made to be the two sheet superposed (four layers) multilayer printed circuit board which has been manufactured in the above-mentioned step and the upper printed circuit board is made to be a single sheet double-sided printed circuit board (two layers), regarding the positional alignment marks, the marks g are added to the marks m and n at both ends of the lower printed circuit board as illustrated in FIG. 9. And, the sharing calculation is be performed in the same way. However, as stated previously, since the marks n1 and n2 of the upper side printed circuit board are already existent on the line that connects the center positions A1 and A2 of the blank or white rendered marks, it becomes indistinguishable. Therefore, is considered to make the positioning difficult that the marks g1 and g2 of the upper printed circuit board are made further to come thereover. On this account, in such a case, the center positions of the marks g1 and g2 of the upper printed circuit board are provided previously at the positions that are spaced by prescribed distances d1 and d2 from the center positions A1 and A2 of the marks of the lower printed circuit board, whereby, if when performing positional alignment correction is made in corresponding relation to these distances d1 and d2, excellent alignment will be procured. In this way, it is possible to manufacture a three sheet superposed (six layers) printed circuit board.

Additionally, as another embodiment of the present invention, it is also possible to construct the movement means as an XY θ table that is equipped with a rotation mechanism in addition to the XY table mechanism and thereby construct it as single movement means. Of course, in this case, such an embodiment becomes different from the preceding embodiments in the procedural mode of performing positional alignment between the upper and lower printed circuit board. Also, although in the foregoing explanation the positional alignment is performed by moving the lower table 11, conversely it is also possible to perform the positional alignment by moving the adsorption head with the lower table being kept unmoved. It is to be noted that although each of the imaging means has been located at the central part of the movement means such as the XY table, it is similarly also possible to provide the imaging means either inside the movement means or outside the movement means.

Further, the imaging means is not limited to a combined unit of the X-ray generator and X-ray camera that are adopted in each of the above-mentioned embodiments. CCD cameras, for example, may be disposed above and below the lower table respectively, whereby it may be arranged that the marks formed in the surfaces of the printed circuit boards are imaged. In this case, it is not necessary that the marks of the lower printed circuit board be rendered white and neither is it necessary that the marks of the upper printed circuit board be smaller in diameter than the blank white rendered marks.

Although in each of the above-mentioned embodiments the electrodes are adopted as the securing means for preliminary fixation that succeeds the positional alignment, an embodiment which uses ultrasonic welding means will now be explained.

Figure 10:
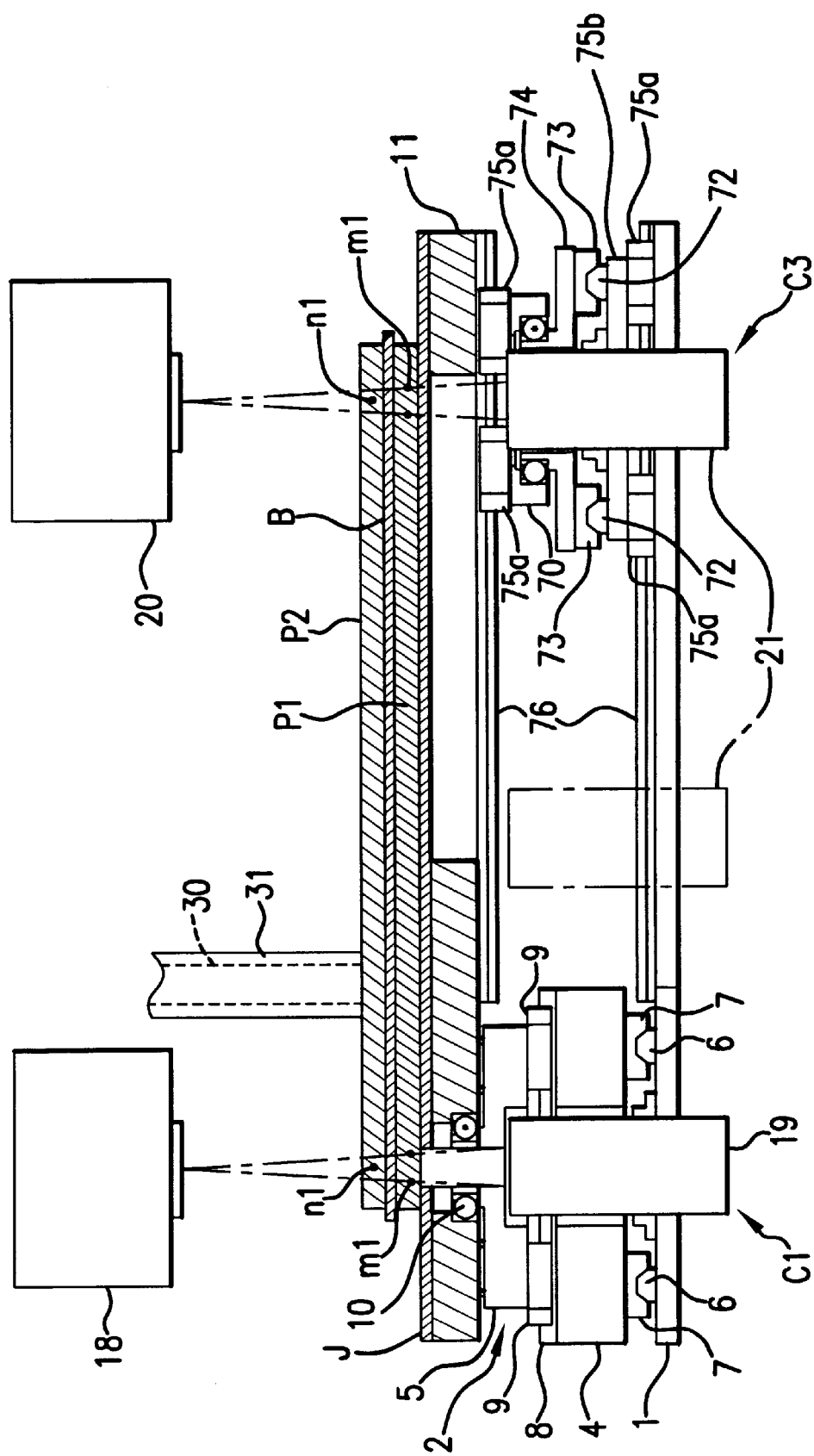
FIG. 10 is a sectional view illustrating an embodiment of the present invention wherein an ultrasonic welding means is provided as the securing means.
Figure 11:
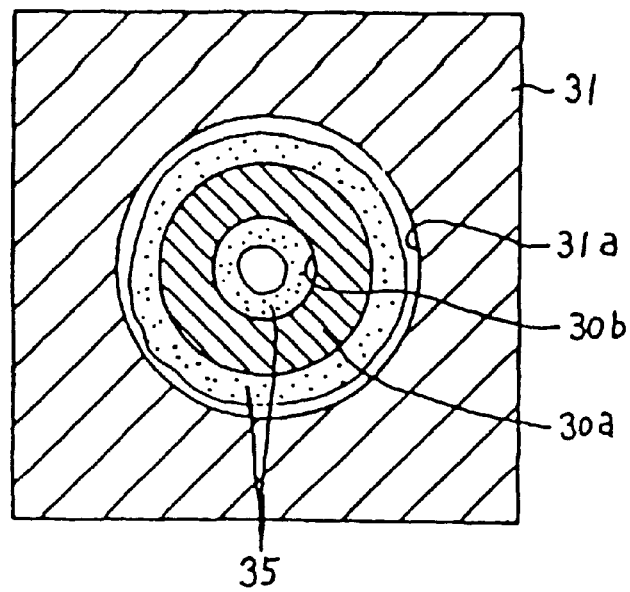
FIG. 11 is a view illustrating a horn in the embodiment illustrated in FIG. 10.

In the embodiment illustrated in FIG. 10, the ultrasonic welding means that comprises a horn 30 for propagating the ultrasonic vibrations and a keeper plate 31 that is provided in such a way as to cover the outside thereof is provided as the securing means. A forward end configuration of this horn 30 and keeper plate 31 (the configuration of the portion thereof abutting against the printed circuit board) is illustrated in FIG. 11. A ring-shaped horn tip end portion 30a is located within an opening 31a that is formed in the keeper plate 31. In this state, after having corrected the positional error of the both printed circuit boards as in the case of the above-mentioned embodiment, the keeper plate 31 is first caused to abut against the upper printed circuit board P2 and the printed circuit boards P1 and P2 are fixed on the lower table 11. In this state, the horn 30 is lowered and caused to abut against the upper printed circuit board P2, whereby ultrasonic vibrations are applied. The ultrasonic vibrations are propagated to the adhesive layer (pre-preg sheet) B between the printed circuit boards P1 and P2, whereby the adhesive layer B is melted and then cooled and cured, with the result that the printed circuit boards are preliminarily secured to each other. The keeper plate 31 serves also to prevent the pre-preg sheet from getting outside the keeper plate 31.

The reason why in this embodiment the horn tip end portion 30a is formed into a configuration shaped like a ring such as that illustrated in the drawing will now be explained.

Figure 13:
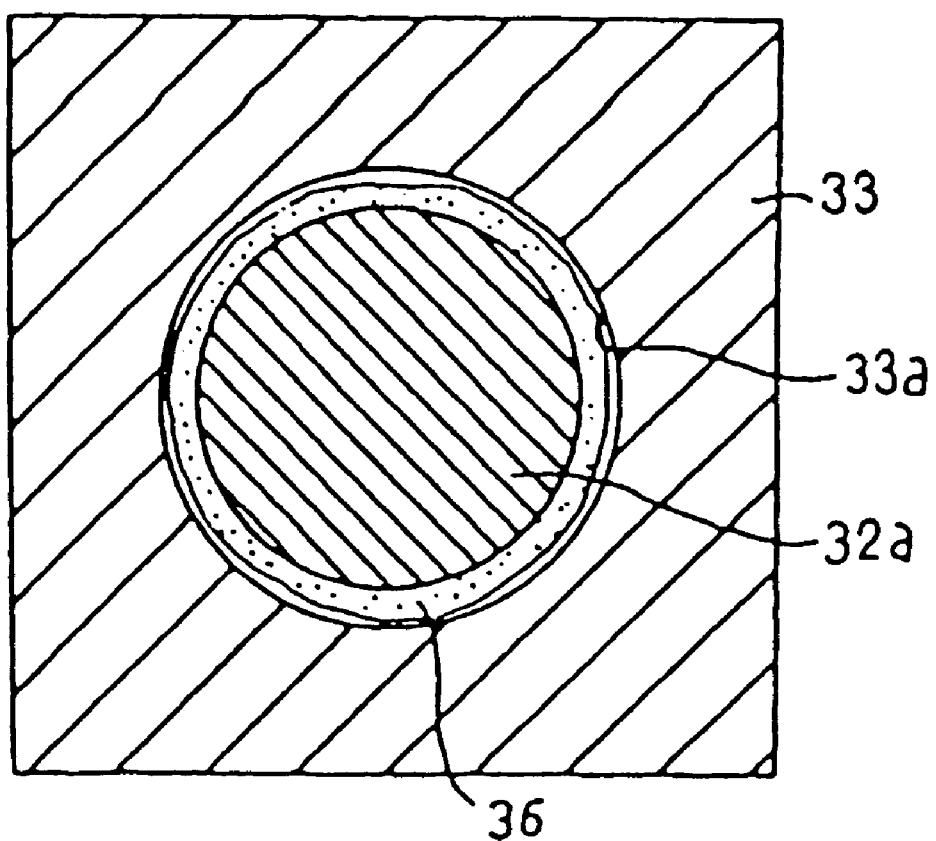
FIG. 13 is a view illustrating a conventional example of the horn.

In a case where, as illustrated in FIG. 13, use is not made of a horn whose tip end is shaped like a ring but a horn which is solid and shaped like a circular column, the position of the adhesive layer that opposes a horn tip end portion 32a is not secured very well. A surrounding area thereof, i.e., a gap between an opening 33a of the keeper plate 33 and an outer periphery of the horn tip end portion 32a undergoes securement (the secured portion is illustrated by dots). Accordingly, the actual secured portion 35 is relatively small in area, namely the efficiency is poor and the adhesion is inferior. When, as illustrated in FIG. 13, the difference between a caliber of the opening 33a of the keeper plate 33 and an outside diameter of the horn tip end portion 32a is relatively small, particularly the area of the secured portion 36 becomes small and, as a result, the adhesion is liable to become inferior. This is because at the position opposing the horn tip end portion 32a the melted pre-preg is subjected to repeated confluence and separation by the vibration of the horn and therefore is unstable. For this reason, it is necessary to set strictly the proper adhering conditions. However, it is not easy to set such adhering conditions and it is also not easy to maintain such adhering conditions.

In view of the above, when the horn 30, whose tip end is shaped like a ring as illustrated in FIG. 11, is used, the melted pre-preg is gathered at a recessed portion 30b inside the ring-shaped abutment portion and at a slit-shaped portion outside it (the gap between an opening 31a of the keeper plate 31 and the outer periphery of the horn tip end portion 30a). It is avoided that the gathered pre-pregs are subjected to confluence and separation as a result of the effect thereon of the vibration of the horn. Therefore, they become stable, with the result that the area of the secured portion 35 widens, whereby highly efficient and firm adhesion and securement are obtained.

Figure 12:
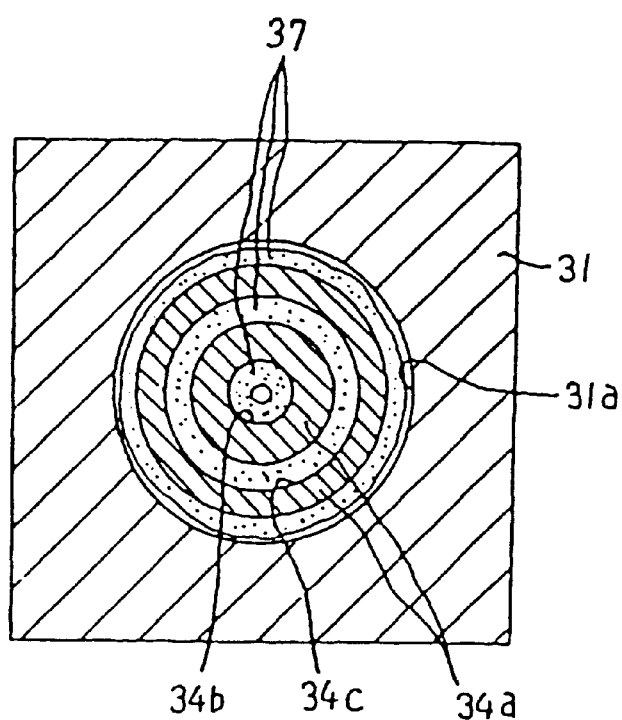
FIG. 12 is a view illustrating another example of the horn.

Also, when as illustrated in FIG. 12 use is made of a horn whose tip end portion 34a is shaped like a double-ring configuration, a secured portion 37 is made at each of an inside recessed portion 34b, intermediate slit portion 34c and outside slit-shaped portion (the gap between the opening 31a of the keeper plate 31 and the outer periphery of the horn tip end portion 34a), whereby the adhesion efficiency is increased.

It is to be noted that the bonding method for bonding the both printed circuit boards is not limited to bondage that is made with the use of the electrode and the ultrasonic bond technique as stated previously. The bondage may be one which uses an adhesive agent, securing one that uses eyelets or one which uses soldering. It is also to be noted that the bondage may be also performed by having a hot presser device incorporated beforehand in this apparatus and immediately after positional alignment performing total bondage without performing the above-mentioned preliminary securing.

Also, although in the above-mentioned embodiment the respective printed circuit boards and adhesive layer have been transferred automatically and set by the second supporting means 17, the respective printed circuit boards and adhesive layer are placed manually on the lower table 11 and thereafter only the upper printed circuit board alone is adsorbed by the second supporting means 17 to thereafter start the positional aligning operation.

According to the present invention, since a pair of the printed circuit boards, each having formed therein the marks for positional alignment, are supported in a state opposing each other with the non-cured adhesive layer therebetween and the marks are image processed and the positional error are corrected thereby and in this state the securing operation for securing the paired printed circuit boards is performed, it is possible to manufacture a multilayer printed circuit board that has a high positional aligning accuracy.

Also, since the adhesive layer is formed on either one of the paired printed circuit boards and the other printed circuit board is supported with a prescribed gap therebetween in a state of non-contact therewith and is moved for positional alignment of the both printed circuit boards and thereafter adhered onto the adhesive layer, both the printed circuit boards are secured to each other in a state of their having been accurately positionally aligned without being obstructed by the adhesive layer.

Further, in a case where there is produced a difference between the distance between the marks of the one printed circuit board and the distance between the marks of the other printed circuit board, this difference error is calculated and the value of a half of it is shared whereby the both printed circuit boards are relatively moved and positionally aligned. This makes it possible to perform easily more accurate positional alignment.

If as the marks that are used for the positional alignment the marks of the one printed circuit board are rendered blank and the marks of the other printed circuit board are each made smaller in diameter than the blank rendered mark, the calculation of a center position of each mark becomes easy and this contributes to promoting the automation of the positional alignment.

Also, since each of the paired printed circuit boards may be a single-layer printed circuit board, a two sheet superposed multilayer printed circuit board or a plurality of preliminarily secured printed circuit boards, it is possible to easily manufacture a multilayer printed circuit board prepared by laminating a three or more sheet superposed printed circuit board.

And, the multilayer printed circuit board manufacturing apparatus according to the present invention makes it possible to manufacture a multilayer printed circuit board whose positional alignment is made accurate through the manufacturing method according to the present invention.

Also, if the jig plate equipped with a plurality of opening portions, the distances between the centers of these opening portions being previously known, is provided on one of the supporting means, whereby determination is performed of the mark positions of the respective printed circuit boards on the basis of those opening portions, the positional alignment cannot only be made more accurately and easily but there is also the merit that the positional alignment becomes easy at the time of, for example, replacement of the imaging means.

If the ultrasonic welding means which has a horn whose tip end is substantially shaped like a ring is used as the securing means for bonding the both printed circuit boards, highly efficient adhesion and securement can be obtained.

What is claim is:

1. A manufacturing method for manufacturing a multilayer printed circuit board, comprising the steps of:

supporting first and second printed circuit boards, each having first and second end portions with first and second marks respectively therein, in a state wherein said first and second printed circuit boards oppose each other with said first end portions and second end portions respectively superposed and with an adhesive layer therebetween in an uncured state;

simultaneously imaging the first marks in the first end portions of the first and second printed circuit boards by a first imaging means to produce image data of a first image simultaneously showing positions of the first marks and simultaneously imaging the second marks in the second end portions of the first and second printed circuit boards by a second imaging means to produce image data of an second image simultaneously showing positions of the second marks;

inspecting the positions of the first marks and the second marks by image processing the image data of the first image and image processing the image data of the second image;

determining a relative positional error in relative alignment of the first and second printed circuit boards using the image processings;

correcting the relative positional error by moving the first and second printed circuit boards relative to one another; and securing the first and second printed circuit boards to each other in a state where the relative positional error is corrected.

2. The manufacturing method for manufacturing a multilayer printed circuit board as set forth in claim 1, wherein:

the adhesive layer is disposed on one of the first and second printed circuit boards;

another one of the first and second printed circuit boards is supported a prescribed distance apart from the adhesive layer prior to said inspecting; and said securing includes laminating the another one of said first and second printed circuit boards on the adhesive layer.

3. The manufacturing method for manufacturing a multilayer printed circuit board as set forth in claim 1 or 2, wherein:

said determining said relative positional error includes finding;

a first board mark distance between the first and second marks of the first printed circuit board;

a second board mark distance between the first and second marks of the second printed circuit board and a half difference error equal to half a mark distance difference between the first board mark distance and the second board mark distance; and said correcting said relative positional error includes relatively moving the first and second printed circuit boards to position said first marks a distance from each other equal to said half difference error and said second marks a distance from each other equal to said half difference error.

4. The manufacturing method for manufacturing a multilayer printed circuit board as set forth in one of claims 1 or 2, wherein the first and second marks of one of the first and second printed circuit boards are ring shaped marks and the first and second marks of another one of the first and second printed circuit boards have a diameter smaller than an inner diameter of the first and second marks of said one of said first and second printed circuit boards, whereby the imaging is performed in a state where the first and second marks of the another one of said first and second printed circuit board are respectively located within corresponding ones of the ring shaped marks.

5. The manufacturing method for manufacturing a multilayer printed circuit board as set forth in one of claims 1 or 2, wherein at least one of the first and second printed circuit boards is a multilayer printed circuit board.

6. The manufacturing method for manufacturing a multilayer printed circuit board as set forth in one of claims 1 or 2, further comprising the steps of:

disposing a jig plate having at least first and second apertures set apart a predetermined distance so as to be superposed on the first and second printed circuit boards during said imaging;

imaging the first aperture of the jig plate during said imaging of the first marks by the first imaging means and imaging the second aperture of the jig plate during said imaging of the second marks by the second imaging means;

determining by the image processing center positions of said first and second apertures within image regions of respective ones the first and second imaging means;

calculating an imaging means separation distance between the first and second imaging means based on the center positions of the first and second apertures within respective ones of the image regions and the predetermined distance between the first and second apertures; and determining amounts of relative movements for said correcting the relative positional errors of the first and second printed circuit boards based on the imaging means separation distance.

7. The manufacturing method for manufacturing a multilayer printed circuit board as set forth in one of claims 1 or 2, wherein said securing the first and second printed circuit boards includes applying ultrasonic vibrations by use of a horn having a tip end portion substantially shaped as a ring, and thereafter causing fusion of the adhesive layer clamped between the first and second printed circuit boards.

8. The manufacturing method for manufacturing a multilayer printed circuit board as set forth in claim 1, wherein said first imaging means and said second imaging means are x-ray imaging means.

9. A manufacturing method for manufacturing a multilayer printed circuit board, comprising the steps of:

supporting first and second printed circuit boards, each having first and second end portions with first and second marks respectively therein, in a state wherein said first and second printed circuit boards oppose each other with said first end portions and second end portions respectively superposed and with an adhesive layer therebetween in an uncured state;

simultaneously imaging the first marks in the first end portions of the first and second printed circuit boards by a first x-ray imaging means to produce image data of a first image simultaneously showing positions of the first marks and simultaneously imaging the second marks in the second end portions of the first and second printed circuit boards by a second x-ray imaging means to produce image data of a second image simultaneously showing positions of the second marks;

inspecting the positions of the first marks and the second marks by image processing the image data from said first and second imaging means;

determining a relative positional error in relative alignment of the first and second printed circuit boards using the image processings;

correcting the relative positional error by moving the first and second printed circuit boards relative to one another; and securing the first and second printed circuit boards to each other in a state where the relative positional error is corrected.

10. The manufacturing method for manufacturing a multilayer printed circuit board as set forth in claim 9, wherein:

the adhesive layer is disposed on one of the first and second printed circuit boards;

another one of the first and second printed circuit boards is supported a prescribed distance apart from the adhesive layer prior to said inspecting; and said securing includes laminating the another one of said first and second printed circuit boards on the adhesive layer.

11. The manufacturing method for manufacturing a multilayer printed circuit board as set forth in claim 9 or 10, wherein:

said determining said relative positional error includes finding:

a first board mark distance between the first and second marks of the first printed circuit board;

a second board mark distance between the first and second marks of the second printed circuit board; and a half difference error equal to half a mark distance difference between the first board mark distance and the second board mark distance; and said correcting said relative positional error includes relatively moving the first and second printed circuit boards to position said first marks a distance from each other equal to said half difference error and said second marks a distance from each other equal to said half difference error.

12. A manufacturing apparatus for manufacturing a multilayer printed circuit board wherein first and second printed circuit boards each have first and second end portions with first and second marks formed respectively therein and the first and second printed circuit boards are to be secured to each other by an adhesive layer, comprising:

first supporting means for supporting said first printed circuit board;

second supporting means for supporting said second printed circuit board superposed on said first printed circuit board;

a first imaging means for simultaneously imaging the first marks of the first and second printed circuit boards to produce image data of a first image simultaneously showing positions of the first marks;

a second imaging means for simultaneously imaging the second marks of the first and second printed circuit boards to produce image data of a second image simultaneously showing positions of the second marks;

image processing means for processing the image data from said first and second imaging means to determine positions of said first marks and said second marks;

movement means for effecting relative movement of the first and second printed circuit boards in order to correct a relative positional error in relative alignment of the first and second printed circuit boards based on the positions of the first marks and the second marks determined by said image processing means; and securing means for securing the first and second printed circuit boards to each other in a state where the relative positional error is corrected.

13. The manufacturing apparatus for manufacturing a multilayer printed circuit board as set forth in claim 12, wherein the movement means includes a first XY table means for moving the first printed circuit board in a lengthwise direction and a widthwise direction thereof and a second XY table means for moving the first printed circuit board in the widthwise direction.

14. The manufacturing apparatus for manufacturing a multilayer printed circuit board as set forth in claim 12 or 13, wherein at least one of the first and second supporting means includes means for moving said first and second printed circuit boards toward and away from each other.

15. The manufacturing apparatus for manufacturing a multilayer printed circuit board as set forth in one of claims 12 or 13, further comprising:

a jig plate disposed on one of the first and second supporting means;

the jig plate having at least first and second apertures for positional confirmation of the first and second imaging means, the apertures being formed spaced apart a predetermined distance, said first aperture being imageable by the first imaging means simultaneously with the first marks when the first and second printed circuit boards are superposed; and said second aperture being imageable by the second imaging means simultaneously with the second marks when the first and second printed circuit boards are superposed.

16. The manufacturing apparatus for manufacturing a multilayer printed circuit board as set forth in one of claims 12 or 13, wherein the securing means is ultrasonic welding means having a horn with a tip end portion that is substantially ring shaped.

17. The manufacturing apparatus for manufacturing a multilayer printed circuit board as set forth in claim 13, wherein said first imaging means and said second imaging means are x-ray imaging means.

18. A manufacturing apparatus for manufacturing a multilayer printed circuit board wherein first and second printed circuit boards each have first and second end portions with first and second marks formed respectively therein and the first and second printed circuit boards are to be secured to each other by an adhesive layer, comprising:

first supporting means for supporting said first printed circuit board;

second supporting means for supporting said second printed circuit board superposed on said first printed circuit board;

a first x-ray imaging means for simultaneously imaging the first marks of the first and second printed circuit boards to produce image data of a first image simultaneously showing positions of the first marks;

a second x-ray imaging means for simultaneously imaging the second marks of the first and second printed circuit boards to produce image data of a second image simultaneously showing positions of the second marks;

image processing means for processing the image data from said first and second x-ray imaging means to determine positions of said first marks and said second marks;

movement means for effecting relative movement of the first and second printed circuit boards in order to correct a relative positional error in relative alignment of the first and second printed circuit boards based on the positions of the first marks and the second marks determined by said image processing means; and securing means for securing the first and second printed circuit boards to each other in a state where the relative positional error is corrected.

19. The manufacturing apparatus for manufacturing a multilayer printed circuit board as set forth in claim 18, wherein the movement means includes a first XY table means for moving the first printed circuit board in a lengthwise direction and a widthwise direction thereof and a second XY table means for moving the first printed circuit board in the widthwise direction.

20. The manufacturing apparatus for manufacturing a multilayer printed circuit board as set forth in claim 18 or 19, wherein at least one of the first and second supporting means includes means for moving said first and second printed circuit boards toward and away from each other.

21. The manufacturing apparatus for manufacturing a multilayer printed circuit board as set forth in one of claims 18 or 19, further comprising:

a jig plate disposed on one of the first and second supporting means;

the jig plate having at least first and second apertures for positional confirmation of the first and second x-ray imaging means, the apertures being formed spaced apart a predetermined distance;

said first aperture being imageable by the first x-ray imaging means simultaneously with the first marks when the first and second printed circuit boards are superposed; and said second aperture being imageable by the second x-ray imaging means simultaneously with the second marks when the first and second printed circuit boards are superposed.

22. The manufacturing apparatus for manufacturing a multilayer printed circuit board as set forth in one of claims 18 or 19, wherein the securing means is ultrasonic welding means having a horn with a tip end portion that is substantially ring shaped.

* * * * *

UNITED STATES PATENT AND TRADEMARK OFFICE
CERTIFICATE OF CORRECTION

PATENT NO. : 6,000,124
DATED : December 14, 1999
INVENTOR(S) : Tsutomu Saito et al It is certified that error appears in the above-identified patent and that said Letters Patent is hereby corrected as shown below:

In the drawings:

In Fig. 1, add the numeral --142-- and the letter --M--;

In Fig. 2, add the letter --M--;

In Fig. 7, add the numeral --63--; change "n1" to --n2--; and change "m1" to --m2--;

In Fig. 10, add the numeral --63--; change "n1" to --n2--; and change "m1" to --m2--;

Signed and Sealed this

Fifteenth Day of August, 2000

Attest:

Q. TODD DICKINSON

*Attesting Officer*     *Director of Patents and Trademarks*